United States Patent
Okamoto

(10) Patent No.: US 6,504,731 B2
(45) Date of Patent: Jan. 7, 2003

(54) INTERCHANGEABLE OPERATING COMPONENT PLACEMENT SYSTEM FOR ELECTRONIC EQUIPMENT

(75) Inventor: Hiroshi Okamoto, Tokyo (JP)

(73) Assignee: Vertex Standard USA, Inc., Cypress, CA (US)

( * ) Notice: Subject to any disclaimer, the term of this patent is extended or adjusted under 35 U.S.C. 154(b) by 0 days.

(21) Appl. No.: 10/190,201

(22) Filed: Jul. 5, 2002

(65) Prior Publication Data

US 2002/0176242 A1 Nov. 28, 2002

Related U.S. Application Data

(63) Continuation of application No. 09/817,923, filed on Mar. 26, 2001, now Pat. No. 6,445,595.

(30) Foreign Application Priority Data

Mar. 27, 2000 (JP) ........................................ 2000-086512

(51) Int. Cl.⁷ .......................... H02B 1/20; H01B 7/00; H04B 1/03; B05K 7/02
(52) U.S. Cl. ..................... 361/826; 174/72 A; 455/347; 439/76.1
(58) Field of Search ........................... 361/826; 174/59, 174/65 R, 68.1, 72 A; 439/76.1; 455/347, 540

(56) References Cited

U.S. PATENT DOCUMENTS

| | | | | | |
|---|---|---|---|---|---|
| 4,513,405 A | * | 4/1985 | Hills | ........................... | 369/12 |
| D288,925 S | * | 3/1987 | Gierschick | .................... | D14/73 |
| 4,815,984 A | * | 3/1989 | Sugiyama et al. | ........... | 439/211 |
| 4,928,205 A | * | 5/1990 | Duback et al. | ............. | 361/346 |
| 4,942,499 A | * | 7/1990 | Shibata et al. | .............. | 361/428 |
| 4,974,121 A | * | 11/1990 | Masuko et al. | .............. | 361/428 |
| 5,127,057 A | * | 6/1992 | Chapman | ...................... | 381/86 |
| 5,255,155 A | * | 10/1993 | Sugimoto et al. | ........... | 361/749 |
| 5,391,095 A | * | 2/1995 | Born | .......................... | 439/676 |
| 5,598,627 A | * | 2/1997 | Saka et al. | ..................... | 29/861 |
| 6,067,278 A | * | 5/2000 | Owens et al. | ................... | 369/7 |
| 6,120,327 A | * | 9/2000 | O'Brien et al. | ............. | 439/623 |
| 6,134,192 A | * | 10/2000 | Gorzelski et al. | .............. | 369/2 |
| 6,172,302 B1 | * | 1/2001 | Kasai | .......................... | 174/67 |
| 6,250,706 B1 | * | 6/2001 | Davis, Jr. et al. | ............. | 296/70 |
| 6,286,972 B1 | * | 9/2001 | Sheperd et al. | ............... | 362/86 |
| 6,445,595 B2 | * | 9/2002 | Okamoto | .................... | 361/826 |

* cited by examiner

*Primary Examiner*—David Martin
*Assistant Examiner*—Dameon E. Levi
(74) *Attorney, Agent, or Firm*—Fulwider Patton Lee & Utecht, LLP

(57) ABSTRACT

In an operating component placement system for electronic equipment, assembly units (5) having cables (8) whereby operating components (6a to 6e) are connected to connectors (7a to 7e) are used to mount the operating components (6a to 6e) to a front panel (4), with connectors (7a to 7e) connected to connectors (3a to 3e) on a panel board (3) for signal input for various functions, and the cable lengths for operating component groups (6a to 6c) and (6d and 6e) having the same form established so as to be longer than the maximum distance between the connectors (3a to 3c) and (3d and 3e) to which each operating component group is to be connected on the panel board 3 and hole groups (4a to 4c) and (4d and 4e) for mounting each of the operating component groups to the front panel. Operating components having the same form can be selectively laid out by changing the cable positioning.

12 Claims, 3 Drawing Sheets

INTERCHANGEABLE OPERATING COMPONENT PLACEMENT SYSTEM FOR ELECTRONIC EQUIPMENT

This application is a continuation of U.S. Ser. No. 09/817,923, filed on Mar. 26, 2001, now U.S. Pat. No. 6,445,595, which is incorporated herein by reference in its entirety.

BACKGROUND OF INVENTION

1. Field of the Invention

The present invention relates to an operating component placement system for electronic equipment, and more specifically to a system which enables the selective placement of operating components for various functions on the front panel of electronic equipment such as radio equipment, in accordance with the needs of the operator or the installation location and the like.

2. Related Art

Electronic equipment such as radio equipment has many operating components located on a front panel, the placement of which thereon is done with consideration given to the ease of operation when performing control of the associated functions. For example, the scheme followed in the case of radio equipment is that operating components for changing the frequency, which are often operated (such as rotary encoders) are placed on the right side, operating components for audio volume adjustment (such as potentiometers) are placed on the left side, and switches used to change the mode or select a frequency band (such as pushbutton switches) and squelch level adjusting components (such as potentiometers) are located in the center.

There are a variety of methods of mounting operating components to a front panel, the general method employed being that of pre-assembling operating components to a panel board, and then mounting the panel board to the rear surface of the front panel, so that operating parts of the operating components protrude through or are exposed via holes formed in the front panel, with knobs mounted to protruding shafts that form the operating parts of operating components.

The configuration shown in FIG. 5 and FIG. 6 of the accompanying drawings is that of an example applied to a radio receiver, these drawings being an outer perspective view and an exploded view of the various constituent elements thereof.

In these drawings, the reference numeral 101 denotes a die-cast chassis, 102 is a PCB (printed circuit board), onto which is packaged an electronic circuit, 103 is a top cover, 104 is a bottom cover, 105 are operating components such as potentiometers, rotary encoders, and switches, 106 is a liquid-crystal display panel, 107 is a panel board, 108 is a front panel, 109 are knobs, and 110 is a transparent acrylic sheet, the radio receiver 100 being assembled by the following procedure.

First, the PCB 102 is mounted to the die-cast chassis 101 after the connector 102a is mounted to the PCB 102.

The panel board 107 also is formed by a PCB, the various operating components 105 being soldered or brazed into place with the operating parts thereof passing through the holes pre-formed in the panel board 107, the terminals of each being connected by soldering to the conductive pattern parts of the panel board 107, and the LCD panel being mounted to a window formed in the panel board 107.

A connector-terminated cable 107a is also connected to the panel board 107, thereby completing the overall panel board assembly 107b.

Next, holes and windows are formed also in the front panel 108 at positions corresponding to the holes and windows in the panel board 107, the panel board assembly 107b, to which are mounted the various parts 105, 106, and 107a, being mounted to the rear surface of the front panel 108, and the transparent acrylic sheet 110 being mounted to the window part formed at the front surface of the front panel 108.

Then, the entire front panel 108, to which is mounted the panel board assembly 107b, is mounted to the front surface of the die-cast chassis 101, after which the connector-terminated cable 107a of the panel board assembly 107b is connected to a connector 102a on the PCB 102, and if there are connectors on the rear surface of the die-cast chassis 101, these are also connected to the PCB 102.

After the above is done, the top cover 103 and the bottom cover 104 are mounted to the die-cast chassis 101, and finally knobs 109 are pressed from the front side onto shafts of operating parts of the operating components 105 passing through holds in the front panel 108, thereby completing the assembly of the product (the radio receiver 100).

Recently, to simplify the assembly process, a bracket or the like, to which individual components are mounted, is fixed to the PCB 102, with the parts 105 and 106 being directly mounted to the PCB 102, along with the electronic circuit, so as to achieve an assembly.

Although the layout of the operating components on the front panel as described above is done with the assumption of a right-handed operator, the operator of the radio equipment or the like is naturally not necessarily right-handed, and might have lost the use of the right hand for reason of some disability or injury, making operation extremely difficult.

Additionally, in mobile radio equipment installed in a vehicle, with restrictions in the installation location, there are cases in which fixing the location of operating components results in a worsening of ease of operation.

In view of the above-noted situation, although there is a significant need for placement of operating components to accommodate individual operating conditions, with the operating components 105 assembled to the panel board 107 as noted above, it is not possible to freely change the layout positions of the operating components 105 on the front panel 108. If an attempt is made to change the layout positions, it would be necessary to change the conductive path layout of the panel board 107 and the PCB 102 as well, the result being that only a made to order product could accommodate these changes, this product being highly costly.

In much recent electronic equipment, operating input signals are captured by a microcomputer circuit, which is caused to perform the prescribed control functions, so that operating components having the same attributes often have common specifications.

Thus, in applying a plurality of the same type of operating components, the shapes thereof are in common, and the associated panel holes are the same shape.

Accordingly, it is an object of the present invention, in view of the above-noted problems and the commonality of operating components, to provide a system that enables a maximum of freedom in layout positioning of operating components onto a front panel, in accordance with the operating conditions of a piece of electronic equipment.

SUMMARY OF THE INVENTION

The present invention is a operating component placement system for electronic equipment in which there are groups of parts of the same type of a plurality of operating components disposed on a front panel and in which the holes therefor have a common shape, this system having a panel board having connectors on the front surface corresponding to each of the operating components and a connection circuit for the purpose of connecting terminals of each connector to prescribed input terminals of an electronic circuit, and assembly units for connecting one end of a cable to terminals of a connector connected to the connector on the panel board side and the other end of the cable to individual operating components, wherein the cable length of each assembly unit associated with a group of operating components of the same type and form is made longer than the maximum distance between the connector to be connected to that operating component group on the panel board and the mounting position of that operating component group on the front panel, thereby enabling selection of the mounting position of the operating component of the same type and form on the front panel.

In the present invention, operating components are grouped into assembly units along with a cable and connector, with each operating component being connected, via the cable of its assembly unit, to a corresponding function connector on the panel board side, the cable of an assembly unit for a group of operating components of the same type and form being of a length that allows accommodation of the distance from the mutual connector-to-connector connection position to a selected mounting position of the operating component on the front panel.

Thus, it is possible for a group of operating components of the same type and form to arbitrarily select from each hole formed in the front panel for this operating component group and to mount the operating components into the selected holes, thereby enabling free selection of the layout on the front panel of operating components for various functions in accordance with the operation conditions of the electric equipment.

In the present invention, because assembly groups are formed for each of the operating components, it is desirable that a common method of mounting of the operating component to the front panel be adopted. However, if small boards, in which holes of a common outer shape for passing the operating components are formed are fixed to the front surface side of the operating components of each assembly unit, and a tongue is bent at positions of each operating component on the rear surface of the front panel so as to form a common holding mechanism for grabbing the small boards, it is possible to mount each operating component using a common holding method.

Additionally, with regard to the above-noted holding mechanism, if a metal sheet on which a mounting part for operating components is formed by a pressing operation is joined to the rear surface side of a main panel, and if this metal sheet has holes into which the small boards fit at positions for mounting each operating component on the main panel and tongues formed so as to protrude toward the holes, these tongues being bent toward the rear surface side, it is possible to simplify the manufacturing and assembly processes.

BRIEF DESCRIPTION OF THE DRAWINGS

The above and other features of the present invention will be better understood by reading the description of exemplary embodiments to follow, making reference to the accompanying drawings, of which.

DETAILED DESCRIPTION OF THE PREFERRED EMBODIMENTS

An embodiment of an operating component placement method according to the present invention is described in detail below, with references made to the drawings FIG. 1 to FIG. 4.

Figure 1:
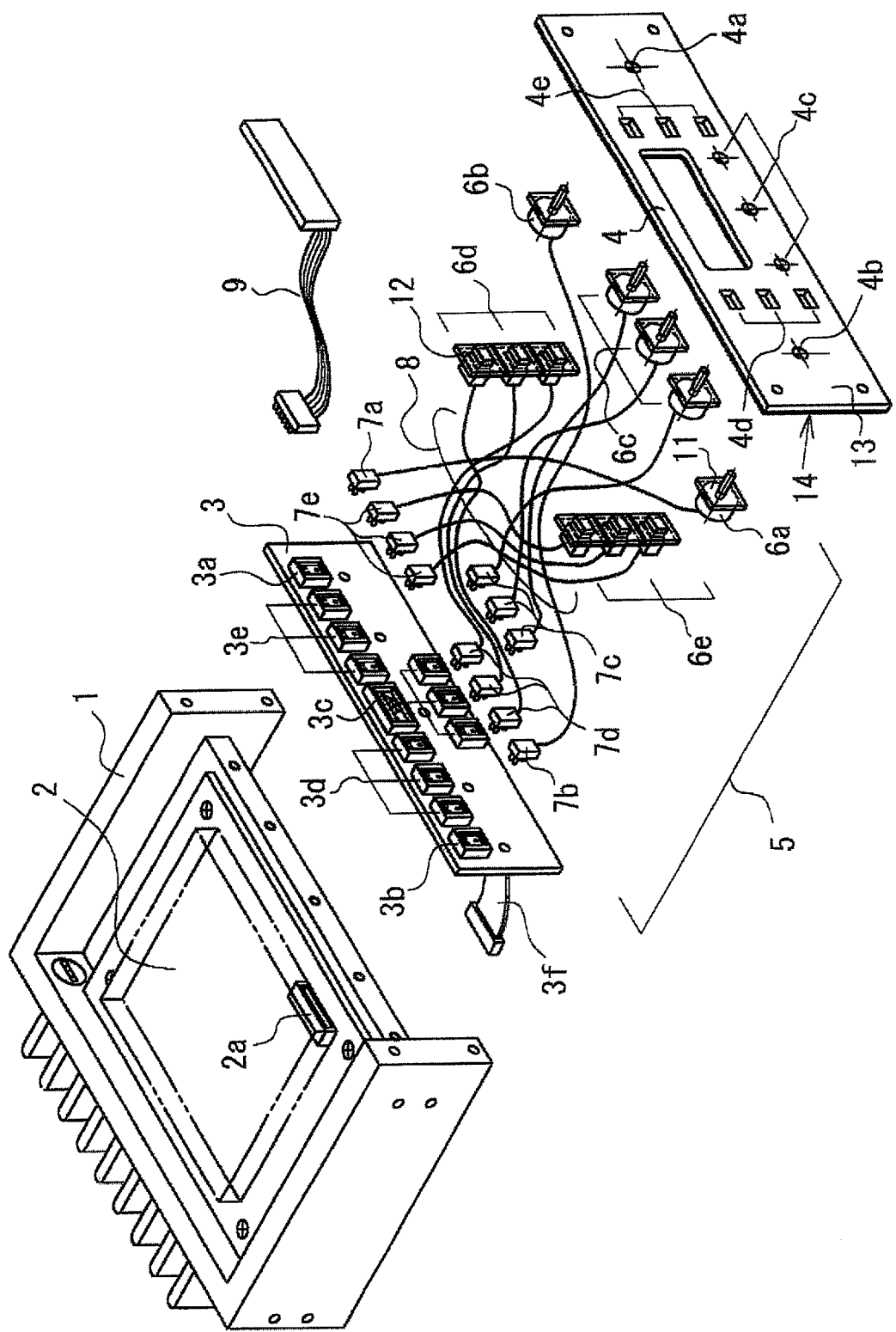
FIG. 1 is an exploded perspective view showing constituent elements of a radio received to which an embodiment of the present invention is applied (with the top and bottom covers removed)

In FIG. 1, which is an exploded perspective view of constituent elements of a radio receiver (with the top and bottom covers removed), the reference numeral 1 denotes a die-cast chassis, 2 is a PCB onto which is packaged an electronic circuit, 3 is a panel board, 4 is a front panel, and 5 is an assembly unit.

The panel board 3 is formed by a PCB, the terminals of connectors (jack side) 3a, 3b, 3c, 3d, and 3e mounted to the front surface side thereof being connected to connector-terminated flat cable 3f, via a conductive pattern formed on the rear surface side thereof, the connection between the connector of the cable 3f and a connector 2a provided on the PCB 2 making a connection between the connectors 3a, 3b, 3c, 3d, and 3e and operating signal input terminals of the electronic circuit.

Therefore, the connectors 3a, 3b, 3c, 3d, and 3e serve as input ports for various operating signals, which represent such operations as change in frequency, adjustment of volume, switching of a mode or band, and adjustment of a squelch level.

In this embodiment, the overall panel board 3 is held to the die-cast chassis 1 by screws.

An assembly unit is fabricated for each of the operating components, one end of each cable 8 being connected to the operating components 6a, 6b, 6c, 6d, and 6e, and the other end being terminated with the connectors (plugs) 7a, 7b, 7c, 7d, and 7e, the connectors 7a, 7b, 7c, 7d, and 7e being connected to the connectors 3a, 3b, 3c, 3d, and 3e of the panel board 3. In FIG. 1, however, it should be noted that the operating components 6c, 6d, and 6e and connectors 7c, 7d, and 7e are shown with 3 operating components together, this being done to simplify the description, with the assembly unit 5 being separate.

The reference numeral 9 denotes an assembly unit for an LCD mounted to the front panel 4, the associated unit also being connected by a connector to the panel board 3 via a cable.

Figure 2:
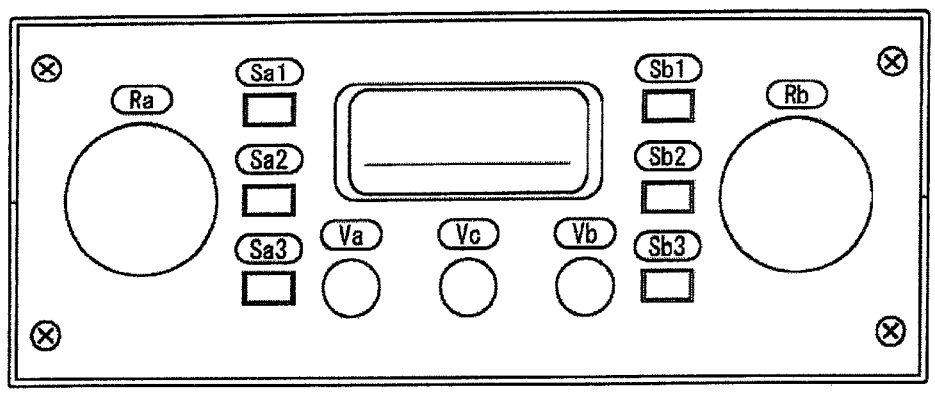
FIG. 2 is a front elevation showing the functional placement of operating components on a front panel.

The front panel 4, as shown in FIG. 1 and FIG. 2, has formed in it mounting holes 4a, 4b, 4c, 4d, and 4e, corresponding to the operating components 6a, 6b, 6c, 6d, and 6e.

In this case, for example, although the operating components 6a and 6b are rotary encoders, the operating component 6c is a potentiometer, and the operating components 6d and 6e are pushbutton switches, the operating component group (6a, 6b, 6c) and the operating component group (6d, 6e) have the same form, so that the holes 4a, 4b, and 4c in the front panel 4 have the same shape, and the holes 4d and 4e in the front panel have the same shape.

A main feature of this embodiment of the present invention is that a cable connection is made for all of the operating components 6a, 6b, 6c, 6d, and 6e using the assembly unit 5, with the cable lengths for similarly formed operating component groups (6a, 6b, 6c) and (6d, 6e) being established so as to be longer than the maximum distance from the mounting hole groups for these similarly formed operating component groups on the front panel 4 to the connector groups (3a, 3b, 3c) and (3d, 3e) on the panel board 3.

In actuality, because there is a space formed between the panel board 3 and the front panel 4 upon assembly, lengths are made sufficient so that there is no problem in making connections to the assembly unit 5, based on this spacing.

The length of the above-noted cables is established separately for the operating component groups (6a, 6b, 6c) and (6d, 6e), and if the lengths are established so as to be longer than the maximum distance among the distances between all the holes 4a, 4b, 4c, 4d, and 4e of the front panel 4 and all of the connectors 3a, 3b, 3c, 3d, and 3e of the panel board 3, it is possible to achieve uniformity in the cable length of the assembly unit 5. For example, according to FIG. 1, because the distance between the hole 4b of the front panel 4 and the connector 3a of the panel board 3 (or the distance between the hole 4a of the front panel 4 and the connector 3b of the panel board 3) is maximum, it is possible to achieve cable length uniformity by establishing the cable lengths as this length.

By configuring each assembly unit 5 in accordance with these conditions, each of the operating components (6a to 6e), organized in the groups (6a, 6b, 6c) and (6d, 6e) of operating components having a similar form, is connected separately to prescribed connectors (3a to 3e) on the panel board 3, and it is possible to select the placement of these operating components into the hole groups (4a, 4b, 4c) and (4d, 4e) of the front panel 4.

That is, because the cable length of each assembly unit 5 is established in accordance with the above-noted conditions, it is possible to dress each of the cables 8 so as to enable selective mounting of each of the operating components (6a to 6e) at holes (4a to 4e) having corresponding shapes.

Therefore, for example, if the standard layout of operating components (6a to 6e) on the front panel 4 for a right-handed operator is such that the operating components 6a, 6b, 6c, 6d, and 6e are mounted into the holes 4a, 4b, 4c, 4d, and 4e, respectively, of the front panel 4, if layout of the operating components on the front panel 4 is to be done for a left-handed person, the cables 8 of the assembly unit 5 can be rearranged so as to reverse the mounting positions of the operating components 6a, 6b, 6c, 6d, and 6e in a left-to-right symmetrical manner with the standard layout.

If the input signal functions corresponding to the connectors 3a, 3b, (3c), (3d), and (3e) on the panel board 3 are Ra, Rb (Va, Vb, Vc), (Sa1, Sa2, Sa3), and (Sb1, Sb2, Sb3), the knob layout on the front panel 4 for a left-handed operator would be as shown in FIG. 2, this exhibiting left-to-right symmetry with respect to the standard layout, which is shown in FIG. 1.

As a result, because it is possible to perform a left-to-right reversal of other knobs and switches with respect to the standard layout, it is only necessary to change the assembly method of the assembly unit 5 at the stage of assembling the product, thereby making it possible to provide a model that accommodates a left-handed operator, as if the model had been made to order for that purpose.

In addition to the standard layout and the layout for a left-handed operator, because the hole groups (4a, 4b, 4c) and (4d, 4e) on the front panel 4 corresponding to the groups of operating components (6a, 6b, 6c) and (6d, 6e) having similar form are formed with a common shape, it is possible within that restriction to achieve an arbitrary layout of the operating components, thereby enabling accommodation of even more detailed operating conditions.

While the front surface of a front panel usually has functional markings near knobs or the exposed parts of operating components thereof, in the case of this embodiment, because the placement of the operating components 6a, 6b, 6c, 6d, and 6e is changed in accordance with operating conditions, it is not appropriate to print such functional markings onto the front panel as was done in the past.

With regard to this problem, it is possible to pre-fabricate printed or embossed seals or plates with function names thereon, and to affix these seals or plates in accordance with the layout of the operating components 6a, 6b, 6c, 6d, and 6e for the various functions, thereby providing a marking of the functions of the respective knobs and switches.

The method of mounting the various operating components 6a, 6b, 6c, 6d, and 6e to the front panel 4 is as follows.

in this embodiment, the operating components 6a, 6b, 6c, 6d, and 6e are part of each assembly unit 5, and while it is possible even at the assembly stage to treat these assembly units 5 as units, because there is a uniform connector connection made to the panel board 3, it is also desirable to have a uniform mounting method for the operating components, thereby simplifying the assembly process.

Given the above, as shown by the reference numerals 11 and 12 in FIG. 1, which represent the operating components 6a and 6d, respectively, small boards are fixed to the front surface side of each of the operating components 6a, 6b, 6c, 6d, and 6e, these small boards 11 and 12 being mounted to the front panel 4 as adaptors.

In this arrangement, the small board 11 is held in place by through insertion of rotating shafts of the rotary encoders or potentiometers of the operating component group (6a, 6b, 6c), and small board 12 is held in place by insertion therethrough of the buttons of the pushbutton switches of the operating component group (6d, 6e).

While use of adhesion is the simplest holding method, it will be understood that it is also possible to adapt another method facilitating the use of the structure of the operating components.

The front panel 4 is formed by joining with a mounting panel 14 fabricated by pressing operations performed on the sheet metal panel 13.

In this case, the mounting panel 14 has formed on it holes in which the small boards 11 and 12 are internally fitted, and tongues formed so as to protrude toward the holes, and bent toward the rear surface side.

Figure 3:
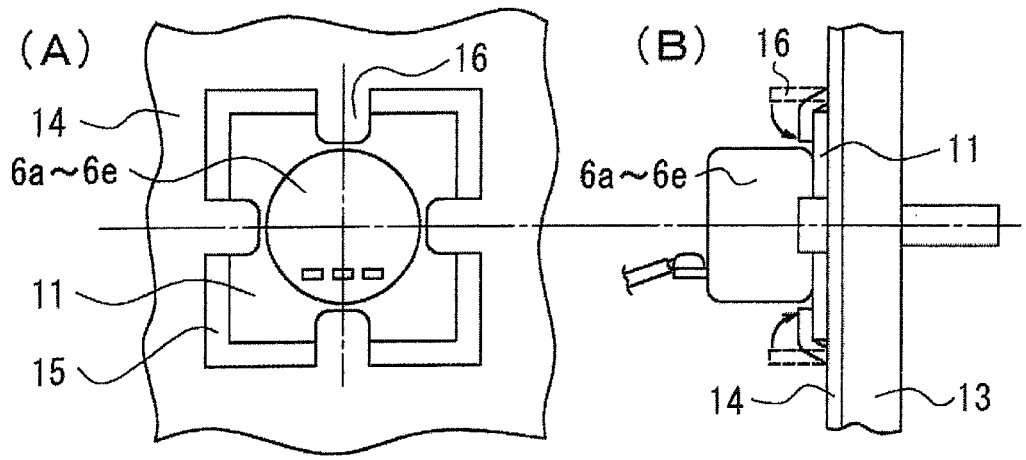
FIG. 3 is a drawing showing the condition of mounting operating components (rotary encoders and potentiometers) onto a front panel, with (A) and (B) being rear and side views thereof.
Figure 4:
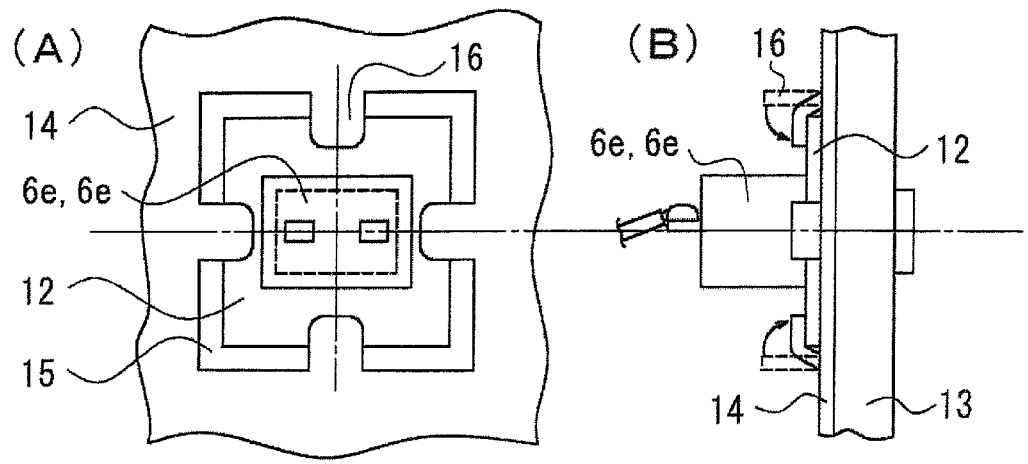
FIG. 4 is a rear view showing the condition of mounting operating components (pushbutton switches) onto a front panel.
Figure 5:
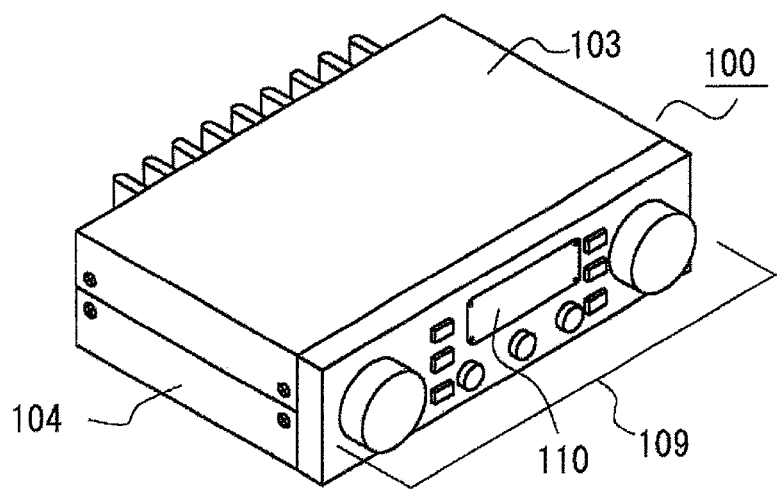
FIG. 5 is an outer perspective view of a radio receiver.
Figure 6:
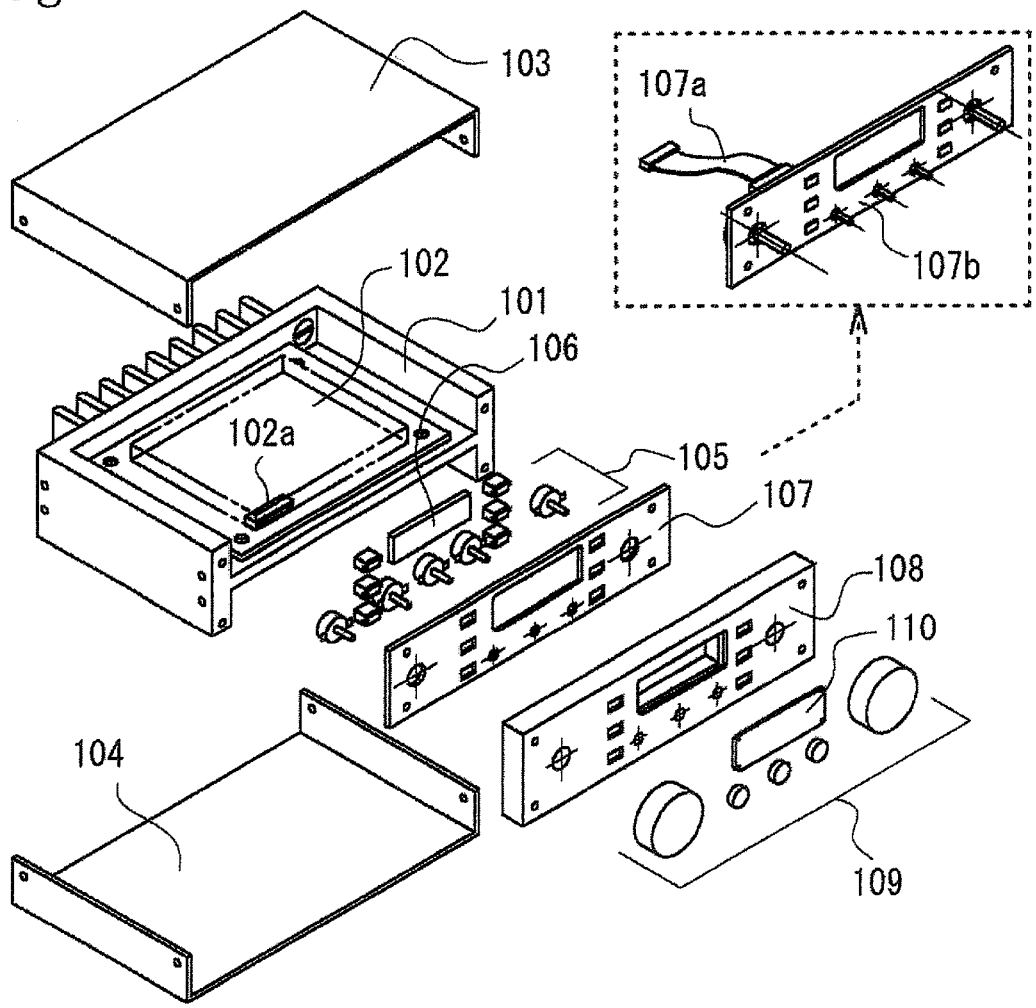
FIG. 6 is an exploded perspective view showing constituent elements of a radio receiver.

More specifically, as shown in FIG. 3 and FIG. 4, which show the rear surface (A) and front surface (B) views of the condition of mounting the operating component groups (6a, 6b, 6c) and (6d, 6e) to the front panel 4, the reference numeral 15 denotes a hole in the mounting panel 14 into which the small boards 11 and 12 are fitted, and the tongues 16 shown in these drawings are formed as one with the mounting panel 14 at the center parts of the four sides of the holes 15.

As shown in FIG. 3(B) and FIG. 4(B), the tongues 16 of the mounting panel 14 are bent vertically toward the rear surface before mounting of the operating components 6a, 6b, 6c, 6d, and 6e, and with the small boards 11 and 12 of the operating components 6a, 6b, 6c, 6d, and 6e fitted into the holes 15, the tongues are then bent inward, so as to hold the small boards 11 and 12 to the front panel 4.

It is therefore possible to mount the operating components 6a, 6b, 6c, 6d, and 6e using a common holding method, thereby simplifying the processing of assembly, compared with the method of mounting each operating component separately.

Additionally, although, as shown in FIG. 3 and FIG. 4, the small boards 11 and 12 are fit loosely into the holes 15, it is alternately possible to establish this as a tight fit, so as to accurately position the operating components 6a, 6b, 6c, 6d, and 6e by the holes 15, and to form a slit in both sides of the tongues 16, so that the tongues 16 can be bent inward from the outside of the holes 15.

By adopting the configuration described above, an operating component placement system for electronic equipment according to the present invention achieves a number of effects.

In a first embodiment of the present invention, in a piece of electronic equipment having a plurality of operating component disposed on a front panel which includes a group of components having the same form, without changing the circuit configuration of the panel board or the PCB, it is possible to freely change the mutual positions of operating components having similar forms on the front panel, thereby facilitating the assembly of a piece of equipment that meets specific desires for ease of operation by not only an operator having a specific dominant hand (for example, a left-handed user) but also a user with impaired hand use.

In alternate embodiments of the present invention, by adopting a common mounting method for operating components of each assembly unit to a front panel, it is possible not only to make connector connections at a far-end of each assembly unit to a panel board, but also to simplify the assembly process.

While several forms of the present invention have been illustrated and described, it will also be apparent that various modifications may be made without departing from the spirit and scope of the invention. Furthermore, while the preferred embodiment of the invention has been described in terms of the dimensions and cross-sectional configurations of various components of the invention it is understood that the invention is not intended to be limited to those specific dimensions or configurations but is to be accorded the full breadth and scope of the claims appended hereto.

What is claimed is:

1. An operating component placement system for an electronic apparatus comprising:

a front panel including at least two access openings having the same form;

at least one operating component constructed to be positioned in either of said openings;

an intermediate printed circuit board having at least one input receiving connector and a primary connector with an elatriacal path therebetween, said input receiving connector corresponding to said at least one operating component;

a chassis having a secondary connector for connecting to said primary connector; and a cable having one end connected to said at least one operating component and a second end connected to said corresponding input receiving connector, said cable having a predetermined length wherein said second end may be connected to said corresponding input receiving connector and said at least one operating component may be placed in either of said access openings of the same form.

2. The operating component placement system as set forth in claim 1 wherein:

said front panel includes more than two access openings, each said opening having a counterpart opening of the same form; and wherein each of said operating components is constructed for placement in at least two of said access openings.

3. The operating component placement system as set forth in claim 1 wherein:

said front panel is constructed with a first half and a mirror image second half.

4. The operating component placement system as set forth in claim 1 wherein:

said cable length for all said operating components constructed to be positioned in either of said access openings is uniform.

5. The operating component placement system as set forth in claim 1 wherein:

at least some of said operating components are grouped together to form multi-component assemblies and at least two of said access openings are formed to align with each of said multi-component assemblies.

6. The operating component placement system as set forth in claim 1 wherein:

said cable is flexible.

7. An operating component placement system for an electronic apparatus having a chassis with a primary connector comprising:

a plurality of operating components, at least two of which are interchangeable;

a front panel having a first position and a second position for each of said interchangeable components, said positions formed by openings in said panel wherein said operating components may be disposed partially within;

a cable for each of said respective interchangeable operating components, said cable including one end connected to said operating component and a second end including a first connector;

an intermediate printed circuit panel having a secondary connector for connecting to said primary connector, said intermediate panel including a predetermined conductive path terminating in a plurality of jacks for receiving a first connector of each cable; and wherein said interchangeable components may be moved from said first position to said second position without altering said conductive path on said intermediate panel.

8. An electronic subassembly for use in assembling an electronic apparatus having a front operating panel with a plurality of corresponding mounting holes for receiving operating components and a chassis with a printed circuit board having a first connector, said subassembly comprising:

an intermediate panel having a first surface including a connector for connecting to said first connector and a second surface including a plurality of jacks and a conductive path between said connector and said jacks;

a plurality of operating components including at least two interchangeable operating components, each of said operating components including a cable terminating in a free end with a plug for connecting to a corresponding said jack on said intermediate panel, said interchangeable operating components including cables of uniform length which is greater than the furthest distance between said corresponding jack and either of said corresponding mounting holes.

9. An assembly unit for conducting an electrical signal between a plurality of operating components and a chassis with a printed circuit board having a secondary connector, said assembly unit comprising:

a front panel for mounting to said chassis, said front panel including at least two access openings having the same form;

an intermediate panel including a plurality of input receiving connectors and a primary connector for connecting to said secondary connector, said intermediate panel further including a printed circuit board forming an conductive electrical path between said input receiving connectors and said primary connector;

a plurality of operating components corresponding to said input receiving connectors, each said component constructed for placement within said access openings having the same form; and a cable having a first end connected to one of said input receiving connectors and a second end connected to said corresponding operating component, said cable length being greater than the maximum distance from an operating component positioned in either of two access openings and the corresponding input receiving connector, when said front panel is connected to said chassis.

10. A method for assembling an electronic apparatus having a chassis with a primary connector and a front panel with a plurality of access openings to be mounted to said chassis wherein said access openings provide a first position and an alternative position for at least one corresponding operating component, said method comprising:

providing a plurality of corresponding operating components for placement in either of said positions and with each said corresponding operating component including a length of cable having a free end terminating in a connector;

providing an assembly unit including a connector board having at least one input receiving connector for each operating component, said connector further including secondary connector and an electrically conductive path between said input receiving connector and said secondary connector;

connecting said primary connector to said secondary connector;

releasably engaging said free end connector of each said cable to a corresponding input receiving connector;

mounting said assembly unit on said chassis;

placing each of said corresponding operating components in either of said positions; and mounting said front panel to said chassis.

11. The method of assembling an electronic apparatus as set forth in claim 10 further comprising:

reversing the positions of at least two said corresponding operating components within said front panel access openings while their respective free end connectors are releasably engage with said input receiving connectors.

12. The method of assembling an electronic apparatus as set forth in claim 10 further comprising:

determining whether said electronic apparatus is to be configured for a left handed or right handed operator to determine an orientation configuration;

upon determining said orientation configuration, placing said operating components within said front panel according to a left handed or right handed configuration.

* * * * *